(12) United States Patent
Benveniste et al.

(10) Patent No.: US 7,723,707 B2
(45) Date of Patent: May 25, 2010

(54) TECHNIQUES FOR PLASMA INJECTION

(75) Inventors: Victor M. Benveniste, Lyle, WA (US); Gordon Angel, Salem, MA (US); Bon-Woong Koo, Andover, MA (US); Kourosh Saadatmand, Merrimac, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 235 days.

(21) Appl. No.: 11/781,700

(22) Filed: Jul. 23, 2007

(65) Prior Publication Data
US 2009/0026390 A1  Jan. 29, 2009

(51) Int. Cl.
*G21G 1/00* (2006.01)
(52) U.S. Cl. ............................ 250/492.3; 250/423 R; 250/424; 250/427; 250/492.1; 250/492.2; 250/492.21; 250/492.22
(58) Field of Classification Search ............ 250/492.1, 250/492.2, 492.21, 492.22, 492.3, 423 R, 250/424, 427, 251
See application file for complete search history.

(56) References Cited

U.S. PATENT DOCUMENTS

| | | | | |
|---|---|---|---|---|
| 4,825,087 A | * | 4/1989 | Renau et al. ............. | 250/492.2 |
| 5,399,871 A | * | 3/1995 | Ito et al. ................ | 250/492.21 |
| 5,703,375 A | * | 12/1997 | Chen et al. ............. | 250/492.21 |
| 6,271,529 B1 | * | 8/2001 | Farley et al. ........... | 250/492.21 |
| 6,762,423 B2 | * | 7/2004 | Liebert et al. .......... | 250/492.21 |
| 6,879,109 B2 | * | 4/2005 | Benveniste et al. ..... | 315/111.21 |
| 7,439,526 B2 | * | 10/2008 | Purser et al. ........... | 250/492.21 |
| 2004/0084635 A1 | * | 5/2004 | Liebert et al. .......... | 250/492.21 |
| 2004/0104657 A1 | | 6/2004 | Kyek | |
| 2006/0169912 A1 | * | 8/2006 | Renau et al. .......... | 250/396 ML |

* cited by examiner

*Primary Examiner*—David A Vanore
*Assistant Examiner*—Michael Maskell

(57) ABSTRACT

Techniques for plasma injection for space charge neutralization of an ion beam are disclosed. In one particular exemplary embodiment, the techniques may be realized as a plasma injection system for space charge neutralization of an ion beam. The plasma injection system may comprise a first array of magnets and a second array of magnets positioned along at least a portion of an ion beam path, the first array being on a first side of the ion beam path and the second array being on a second side of the ion beam path, the first side opposing the second side. At least two adjacent magnets in the first array of magnets may have opposite polarity. The plasma injection system may also comprise a plasma source configured to generate a plasma in a region associated with a portion of the ion beam path by colliding at least some electrons with a gas.

15 Claims, 10 Drawing Sheets

US 7,723,707 B2

TECHNIQUES FOR PLASMA INJECTION

FIELD OF THE DISCLOSURE

The present disclosure relates generally to ion implantation and, more particularly, to techniques for plasma injection for space charge neutralization of an ion beam.

BACKGROUND OF THE DISCLOSURE

Ion implanters are widely used in semiconductor manufacturing to selectively alter the conductivity of materials. In a typical ion implanter, ions generated from an ion source are transported downstream through a series of beamline components which may include one or more analyzer and/or collimator magnets and a plurality of electrodes. The analyzer magnets may be used to select desired ion species and filter out contaminant species or ions having undesirable energies. The collimator magnets may be used to manipulate the shape of the ion beam or otherwise adjust the quality of the ion beam before it reaches a target wafer. Suitably shaped electrodes can be used to modify the energy and the shape of the ion beam. After the ion beam has been transported through the series of beamline components, it may be directed into an end station to perform ion implantation.

FIG. 1 depicts a conventional ion implanter system 100. As is typical for most ion implanters, the system 100 is housed in a high-vacuum environment. The ion implanter system 100 may comprise an ion source 102 and a series of beamline components through which an ion beam 10 passes. The series of beamline components may include, for example, an extraction manipulator 104, a filter magnet 106, an acceleration or deceleration column 108, an analyzer magnet 110, a mass slit 112, a scanner 114, and a collimator magnet 116. Much like a series of optical lenses that manipulate a light beam, the ion implanter components can filter and focus the ion beam 10 before steering it towards a target wafer 118.

As the semiconductor industry keeps reducing feature sizes of micro-electronic devices, ion beams with lower energies are desirable in order to achieve shallow dopant profiles for forming shallow p-n junctions. Meanwhile, it is also desirable to maintain a relatively high beam current in order to achieve a reasonable production throughput. Such low-energy, high-current ion beams may be difficult to transport within typical ion implanters due to space charge blow-up. To prevent "blow-up" of a positive ion beam, negatively charged particles, such as electrons or negative ions, may be introduced for charge neutralization. One way of sustaining space charge neutralization is through magnetic confinement of negatively charged particles. However, existing magnetic confinement approaches tend to introduce extra magnetic field components that cause ion beam distortion. Moreover, in order to improve low-energy beam transportation caused by space charge limitations, a high-energy ion beam may be decelerated to a desired energy level before reaching a target (e.g., a wafer). In such cases, some ions may go through "charge exchange" with surrounding neutral particles, thus losing their charge prior to deceleration and generating neutral particles having high energy. Neutral particles having high energy fail to be decelerated and may impact the target at a higher energy level than desired, thus negatively impacting implantation results.

Low-energy ion beams may be difficult to transport through the beamline to the target due to mutual repulsion between ions having the same charge. High-current ion beams typically include a high concentration of charged ions that tend to diverge due to mutual repulsion. To maintain low-energy, high-current ion beam quality, a plasma may be injected into the ion beam for the purpose of charge neutralization.

High-energy ion implantation beams typically propagate through a weak plasma that is a byproduct of beam interactions with residual or background gas. This plasma tends to neutralize the space charge caused by the ion beam, thereby largely eliminating transverse electric fields that would otherwise disperse the ion beam. However, for a low-energy ion beam, the probability of ionizing collisions with background gas is lower compared to a high-energy ion beam. In addition, low-energy ion beam blow-up may occur at much lower transverse electric field strength.

In view of the foregoing, it may be understood that there are significant problems and shortcomings associated with current techniques for transporting low-energy ion beams.

SUMMARY OF THE DISCLOSURE

Techniques for plasma injection for space charge neutralization of an ion beam are disclosed. In one particular exemplary embodiment, the techniques may be realized as a plasma injection system for space charge neutralization of an ion beam. The plasma injection system may comprise a first array of magnets and a second array of magnets positioned along at least a portion of an ion beam path, the first array being on a first side of the ion beam path and the second array being on a second side of the ion beam path, the first side opposing the second side. At least two adjacent magnets in the first array of magnets may have opposite polarity. The plasma injection system may also comprise a plasma source configured to generate a plasma in a region associated with a portion of the ion beam path by colliding at least some electrons with a gas.

In accordance with other aspects of this particular exemplary embodiment, at least two adjacent magnets in the second array of magnets may have opposite polarity.

In accordance with further aspects of this particular exemplary embodiment, the gas may comprise an inert gas (e.g., argon, nitrogen, xenon, helium, etc.) and/or an electronegative gas.

In accordance with additional aspects of this particular exemplary embodiment, the first array of magnets and the second array of magnets may collectively produce cusp magnetic fields to inject the plasma in or near the ion beam path.

In accordance with yet another aspect of this particular exemplary embodiment, the plasma source may be embedded in a pole piece along at least a portion of the ion beam path.

In accordance with still another aspect of this particular exemplary embodiment, the beamguide may comprise alternating sloped concave portions and sloped convex portions.

In accordance with further aspects of this particular exemplary embodiment, the first array of magnets or the second array of magnets may be located at the convex portion of the beamguide.

In accordance with additional aspects of this particular exemplary embodiment, the beamguide may further comprise a plurality of apertures located at the concave portion of the beamguide.

In accordance with another aspect of this particular exemplary embodiment, at least one of the first array of magnets or the second array of magnets may be a permanent magnet.

In accordance with yet another aspect of this particular exemplary embodiment, at least one magnet in the first array or the at least one magnet in the second array may be configured to direct the flow of the plasma in a "cross-B" (x B) loop.

In accordance with still another aspect of this particular exemplary embodiment, the "cross-B" (x B) loop may be formed by at least one of diamagnetic drift, E cross B drift (E x B), and curvature drift (R x B).

In accordance with further aspects of this particular exemplary embodiment, the first array of magnets may be configured interdigitally.

In accordance with additional aspects of this particular exemplary embodiment, the second array of magnets may be configured interdigitally.

In accordance with another aspect of this particular exemplary embodiment, the first array of magnets and second array of magnets may be positioned in an analyzer magnet.

In accordance with yet another aspect of this particular exemplary embodiment, the first array of magnets and the second array of magnets may be positioned in a collimator magnet.

In accordance with still another aspect of this particular exemplary embodiment, the plasma source may comprise a microwave source and a coil.

In another particular exemplary embodiment, the techniques may be realized as another plasma injection system for space charge neutralization of an ion beam. The plasma injection system may comprise a first array of magnets and a second array of magnets positioned along at least a portion of an ion beam path, the first array being on a first side of the ion beam path and the second array being on a second side of the ion beam path, the first side opposing the second side. At least two adjacent magnets in the first array of magnets may have opposite polarity. The plasma injection system may also comprise an RF power source coupled to at least one of the first array of magnets and at least one of the second array of magnets, and a plasma source configured to generate a plasma in a region associated with a portion of the ion beam path by colliding at least some electrons with a gas.

In accordance with other aspects of this particular exemplary embodiment, the first array of magnets and the second array of magnets may collectively produce cusp magnetic fields to inject the plasma in or near the ion beam path.

In accordance with further aspects of this particular exemplary embodiment, the plasma injection system may further comprise a shield member configured to shield at least one of the first array of magnets and at least one of the second array of magnets from the ion beam path.

In accordance with additional aspects of this particular exemplary embodiment, the shield member may be made from at least one of metal, silicone, elastomer material, and dielectric material.

In accordance with another aspect of this particular exemplary embodiment, the first array of magnets or the second array of magnets may be configured interdigitally.

In yet another particular exemplary embodiment, the techniques may be realized as a plasma confinement system for space charge neutralization of an ion beam. The plasma confinement system may comprise a high transparency grid configured to connect to a ground potential and a plate configured to connect to a negative voltage to repel electrons from the ion beam path.

In accordance with a further aspect of this particular exemplary embodiment, the plasma confinement system may further comprise an ion scraper configured to protect the high transparency grid from direct impinging ions from the ion beam path.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a better understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure overcome inadequacies and shortcomings in existing plasma generation and diffusion techniques used in ion implanters by providing improved techniques for plasma diffusion along an ion beam path in an ion implanter. Instead of diffusing plasma electrons across magnetic dipole field lines, which makes introduction of plasma electrons from an auxiliary source challenging, diffusion of plasma electrons along local magnetic field lines is contemplated.

It should be noted that, although the description hereinafter refers to plasma as the subject of cusp coupling into an ion beam path, embodiments of the present disclosure are not limited to plasmas but may be adapted to any cusp-coupled charged particles, including negative and positive ions. Hereinafter, a magnet, whether a permanent magnet, an electromagnet, or otherwise, may sometimes be referred to as a "cusp magnet" if it is used for a magnetic cusp coupling purpose. Moreover, a cusp line may be referred to as a path parallel to and situated midway between two consecutive cusp magnets. Furthermore, plasma in the present disclosure may include a combination of positive ions and electrons.

Figure 1:
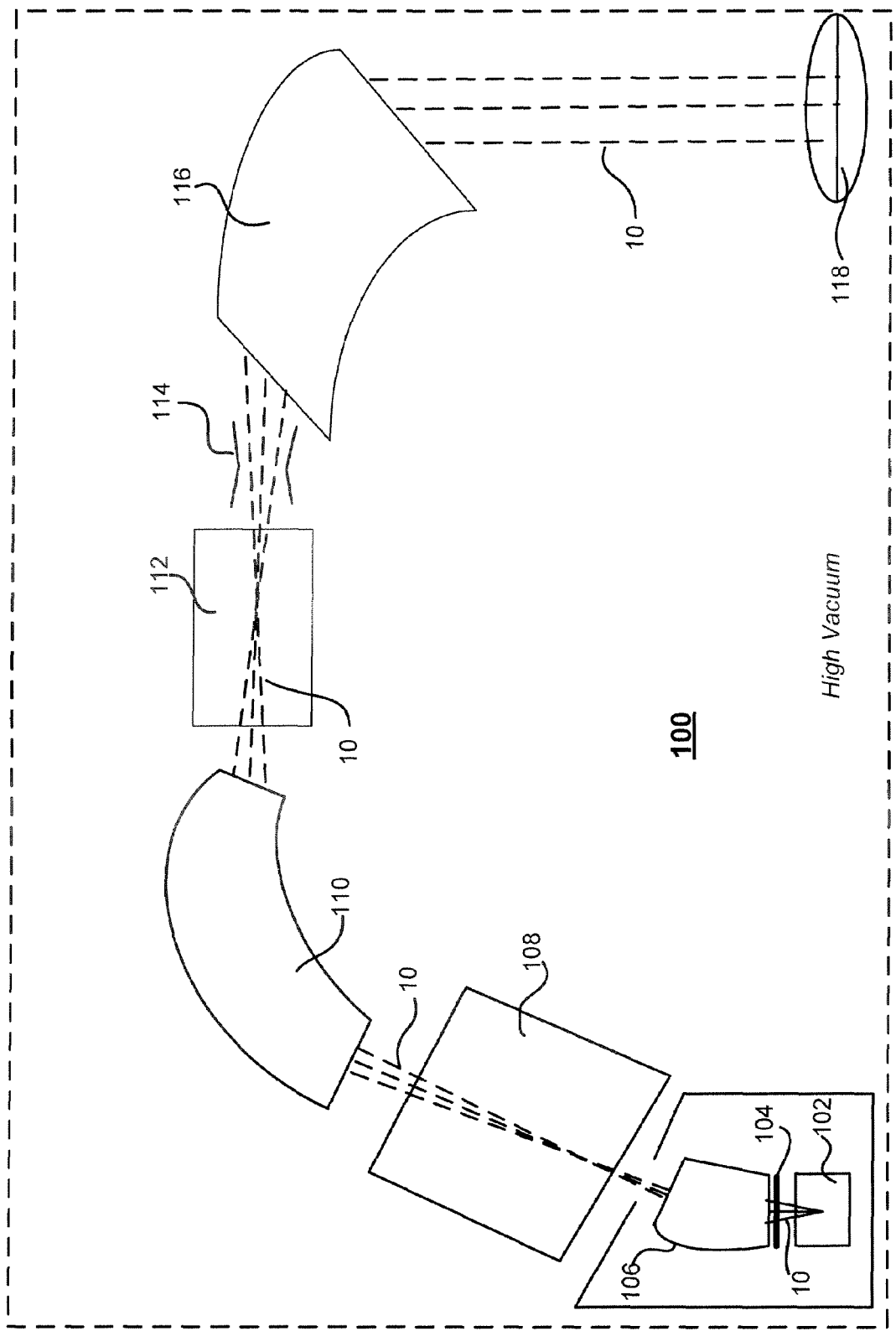
FIG. 1 shows a conventional ion implanter system.
Figure 2:
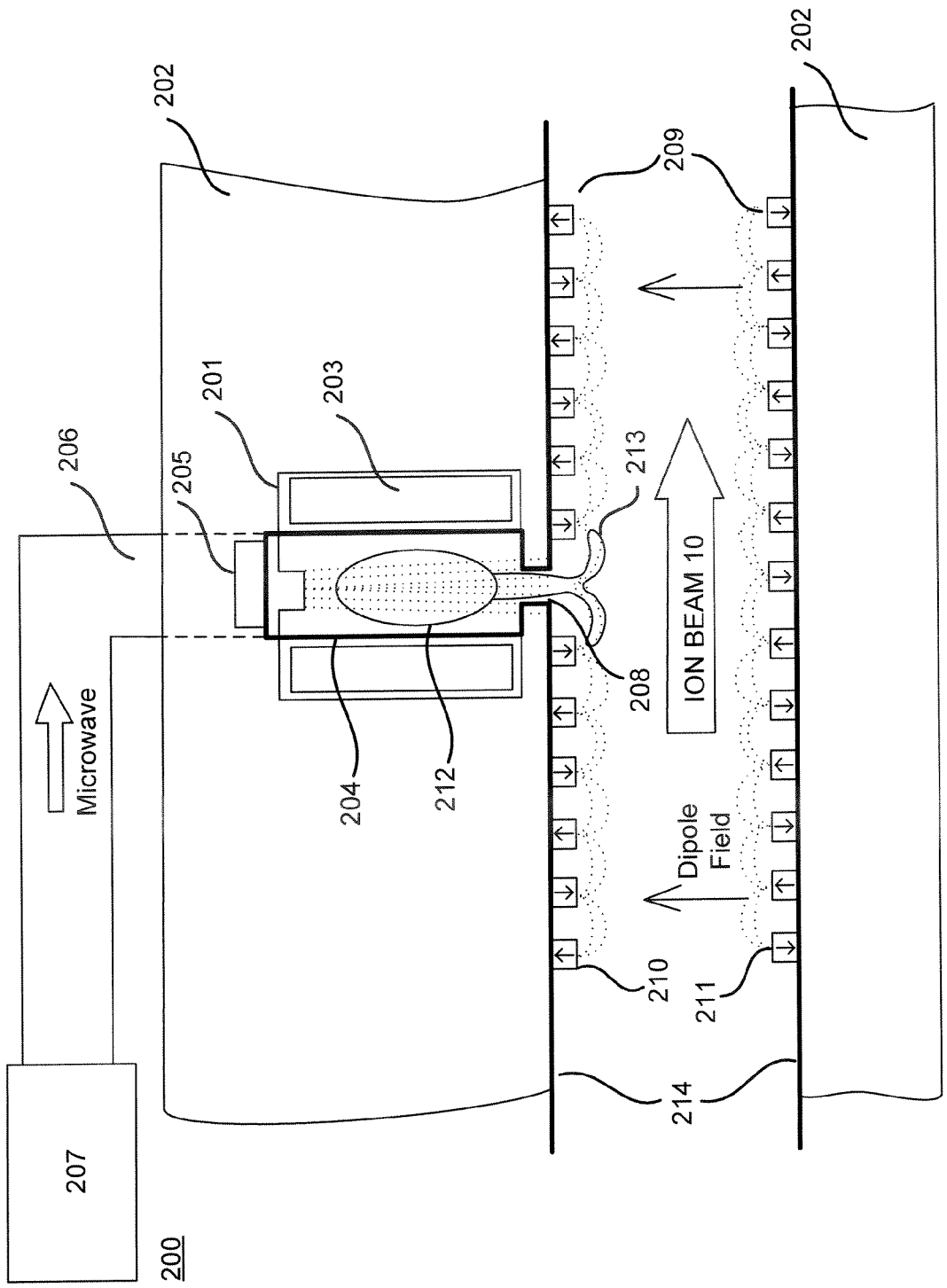
FIG. 2 shows an exemplary sectional view of a cusp coupled plasma injection system in accordance with an embodiment of the present disclosure.

Referring to FIG. 2, there is shown an exemplary sectional view of a cusp coupled plasma injection system 200 in accordance with an embodiment of the present disclosure. The system 200 may comprise a plasma source 201 that may be embedded within a pole piece of bending magnet 202. The plasma source 201 may be located at any magnetized and/or non-magnetized portion of a path of the ion beam 10 between the ion source 102 and the target wafer 118, as shown in FIG. 1. Pole piece of bending magnet 202 may be a magnetic dipole made of metal (e.g., steel, etc.) having a top and a bottom portion. A magnetic coil may be wound around the periphery of the pole piece of the bending magnet 202 to generate a magnetic dipole field. For example, the plasma source 201 may be embedded within the analyzer magnet 110 and/or the collimator magnet 116, as shown in FIG. 1.

Plasma source 201 may be, for example, an electron cyclotron resonance (ECR) plasma source and/or a radio frequency (RF) plasma source. An electron cyclotron resonance (ECR) plasma source, as shown in FIG. 2, may include a magnetic coil 203 located around the outer periphery of a plasma chamber 204 for generating a local magnetic field inside the plasma chamber 204. Moreover, magnetic coil 203 may be permanent magnets in order to generate a magnetic field inside the plasma chamber 204. A dielectric window 205 may be placed at a top end of the plasma chamber 204 for allowing microwave energy to be transmitted therethrough. In addition, the dielectric window 205 may provide a vacuum seal to the plasma chamber 204. The plasma chamber 204 may be coupled to a microwave waveguide 206, through the dielectric window 205, for feeding microwave energy from a microwave source 207. The microwave waveguide 206 may be a metal tube having a cross section suitable to allow microwave energy to travel from the microwave source 207 to the plasma chamber 204. For example, microwave waveguide 206 may be a rectangular aluminum tube.

When microwave energy is introduced through the dielectric window 205, electrons are accelerated via the electron cyclotron resonance within the interior space of the plasma chamber 204. Gas molecules and/or atomic gas within the plasma chamber 204 may be ionized to produce a plasma 212. An auxiliary gas container (not shown) may be coupled to the plasma chamber 204 for introducing gas which may be ionized to generate the plasma 212. The auxiliary gas container may contain helium, neon, nitrogen, argon, krypton, xenon, radon and/or other electronegative or electropositive gases which may be suitable for plasma generation.

The plasma chamber 204 has an aperture 208 extending through an inner wall of the pole piece of the bending magnet 202 and a beamguide 214. Along this inner wall are located plasma extracting magnet arrays 209 for generating a multi-cusped magnetic field. The plasma extracting magnet arrays 209 may be arranged into two arrays, with one array 210 above the path of the ion beam 10 and the other array 211 below the path of the ion beam 10. According to some embodiments, the two plasma extracting magnet arrays 209 may be substantially in parallel with one another. The plasma extracting magnet arrays 209 may be permanent magnets with their magnetic orientation aligned approximately with the propagation direction of the ion beam 10. Also, the plasma extracting magnet arrays 209 may be a coil coupled to a power source in order to generate a multi-cusped magnetic field. Within each array, polarities of individual magnets may be alternated such that multi-cusp magnetic fields may be created in spaces between the magnets (i.e., in or near the beam path of the ion beam 10).

As seen in FIG. 2, plasma extracting magnet arrays 209 may be magnetized longitudinally along the propagation direction of the ion beam 10 and may be arranged such that adjacent magnets have opposite polarity poles. For example, an up arrow in FIG. 2 on the plasma extracting magnet arrays 209 may indicate a north pole while a down arrow may indicate a south pole or vice versa. Adjacent magnets of the plasma extracting magnet arrays 209 may have opposite polarities and generate a multi-cusped magnetic field in order to aid the flow of plasma 212 from the plasma chamber 204 along the direction of the ion beam 10.

The plasma 212 generated in the plasma chamber 204 may be extracted into the ion beam 10 via aperture 208. FIG. 2 illustrates an initial plasma injection region 213, wherein the plasma tends to congregate near the aperture 208 because the magnetic dipole field is perpendicular to the propagation direction of the ion beam 10. In order to uniformly distribute the plasma along the path of the ion beam 10, plasma extracting magnet arrays 209 produce a multi-cusped magnetic field. The multi-cusped magnetic field, in combination with a plasma density gradient and/or an electric field at the "plasma sheath", causes a "cross-B" (x B) drift motion and thus may enable uniform distribution of the initial plasma injection region 213 along the path of the ion beam 10.

Figure 3:
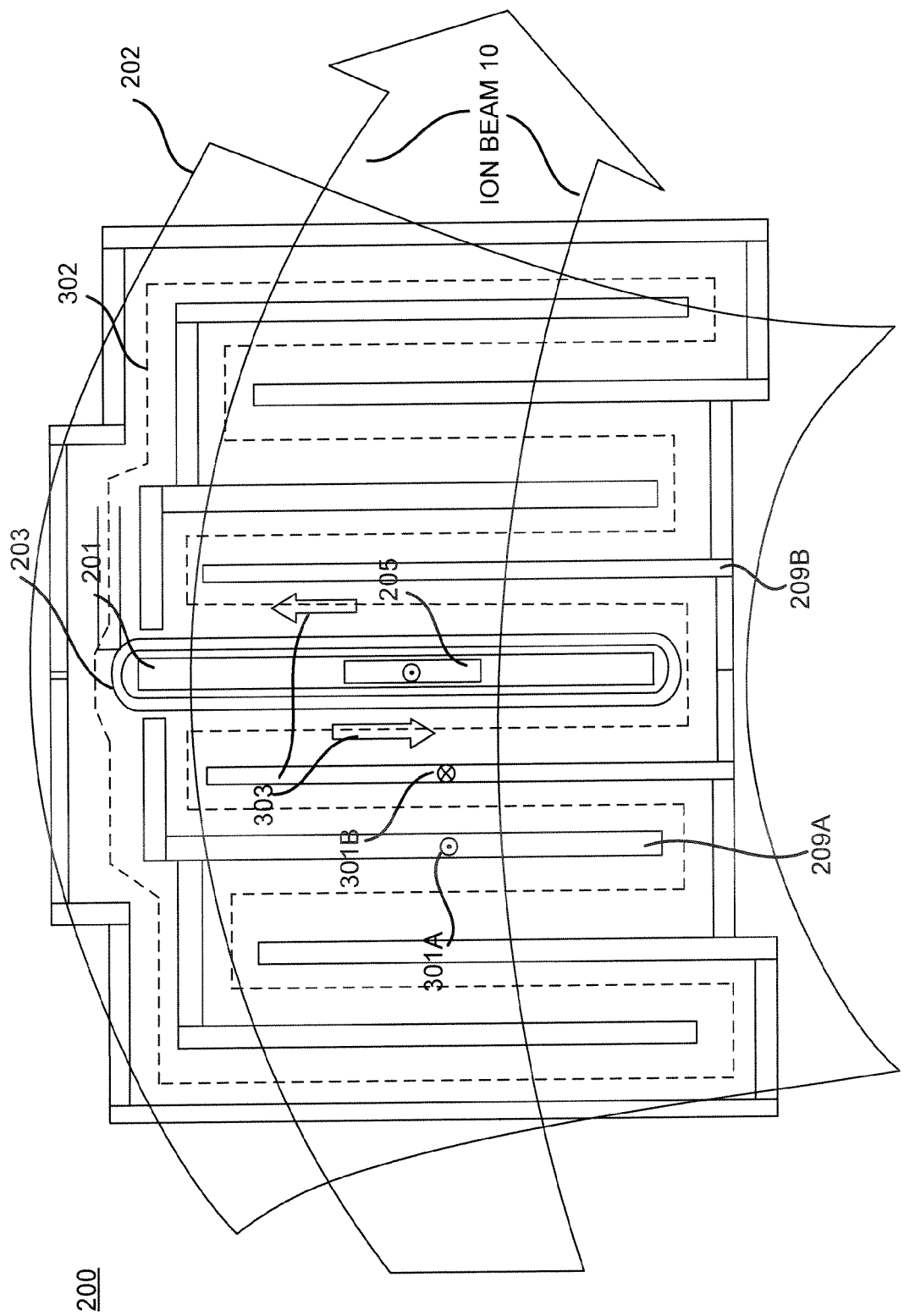
FIG. 3 shows an exemplary planar view of a cusp coupled plasma injection system in accordance with an embodiment of the present disclosure.

FIG. 3 shows an exemplary planar view of the cusp coupled plasma injection system 200 in accordance with an embodiment of the present disclosure. The plasma source 201 may be embedded at the center portion of the pole piece of the bending magnet 202. The plasma extracting magnet arrays 209 may be configured to form pairs of interdigitated magnets 209A and 209B having opposite polarity. For example, magnets 209A may be north pole magnets while magnets 209B may be south pole magnets. Arrows 301A and 301B illustrate the direction of the multi-cusped magnetic field lines produced by magnets 209A and 209B, respectively. The north pole magnets 209A may generate a multi-cusp magnetic field in the direction 301A coming out of the page, while the south pole magnets 209B may generate a multi-cusped magnetic field in the direction 301B going into the page. A cusp line 302 may be demonstrated by the dotted line between the magnets 209A and 209B. Furthermore, arrows 303 illustrate the "cross-B" (x B) drift motion caused by the plasma extracting magnet arrays 209 which may direct the flow of the plasma along the cusp line 302.

Three "cross-B" (x B) drift mechanisms may contribute to the flow of the plasma along the cusp line 302. The first "cross-B" (x B) drift mechanism is a diamagnetic drift which causes the plasma drift in a direction of plasma density gradient ($\nabla$n) cross the multi-cusped magnetic field generated by the plasma extracting magnet arrays 209 (B) ($\nabla$n x B). The diamagnetic drift may be caused by a plasma density gradient between a plasma column and surrounding chamber walls. The gradient in plasma density gives rise to a drift in a direction perpendicular to both the plasma density gradient and the magnetic field, and thus directs the flow of plasma 212 along the cusp line 302.

The second "cross-B" (x B) drift mechanism may be defined by the electric field (E) cross the multi-cusped magnetic field generated by the plasma extracting magnet arrays 209 (B) (E x B). The electrical field (E) may be caused by a potential variation inside the initial plasma injection region 213 and/or a potential drop from the plasma to the inner wall of a beamguide 214, which may be referred to as a "sheath". A sheath may be formed in a region between the plasma and the adjacent wall of the beamguide 214 where electron flux to the wall is reduced to a corresponding ion flux. In addition, a sheath region may have a higher electric field than an electric field associated with the plasma. According to the sheath formation mentioned above, the E x B drift mechanism may cause an electric field perpendicular to the inner wall of the beamguide 214. A drift results in a direction perpendicular to both the electric field associated with the sheath formation and the multi-cusped magnetic field generated by plasma extracting magnet arrays 209, thus directing the flow of plasma along the cusp line 302.

Finally, the third "cross-B" (x B) drift mechanism is a curvature drift (R x B) which may be defined by a radius of curvature of the multi-cusped magnetic field generated by the plasma extracting magnet arrays 209 (R) cross the multi-cusped magnetic field generated by the plasma extracting magnet arrays 209 (B) (R x B). The curvature drift (R x B) may be caused by the curvature of the magnetic field lines, through a centrifugal force effect. The curvature drift (R x B) may impart a drift motion perpendicular to both the radius of curvature and the magnetic field, and thus direct the flow of the plasma along the cusp line 302.

Figure 4:
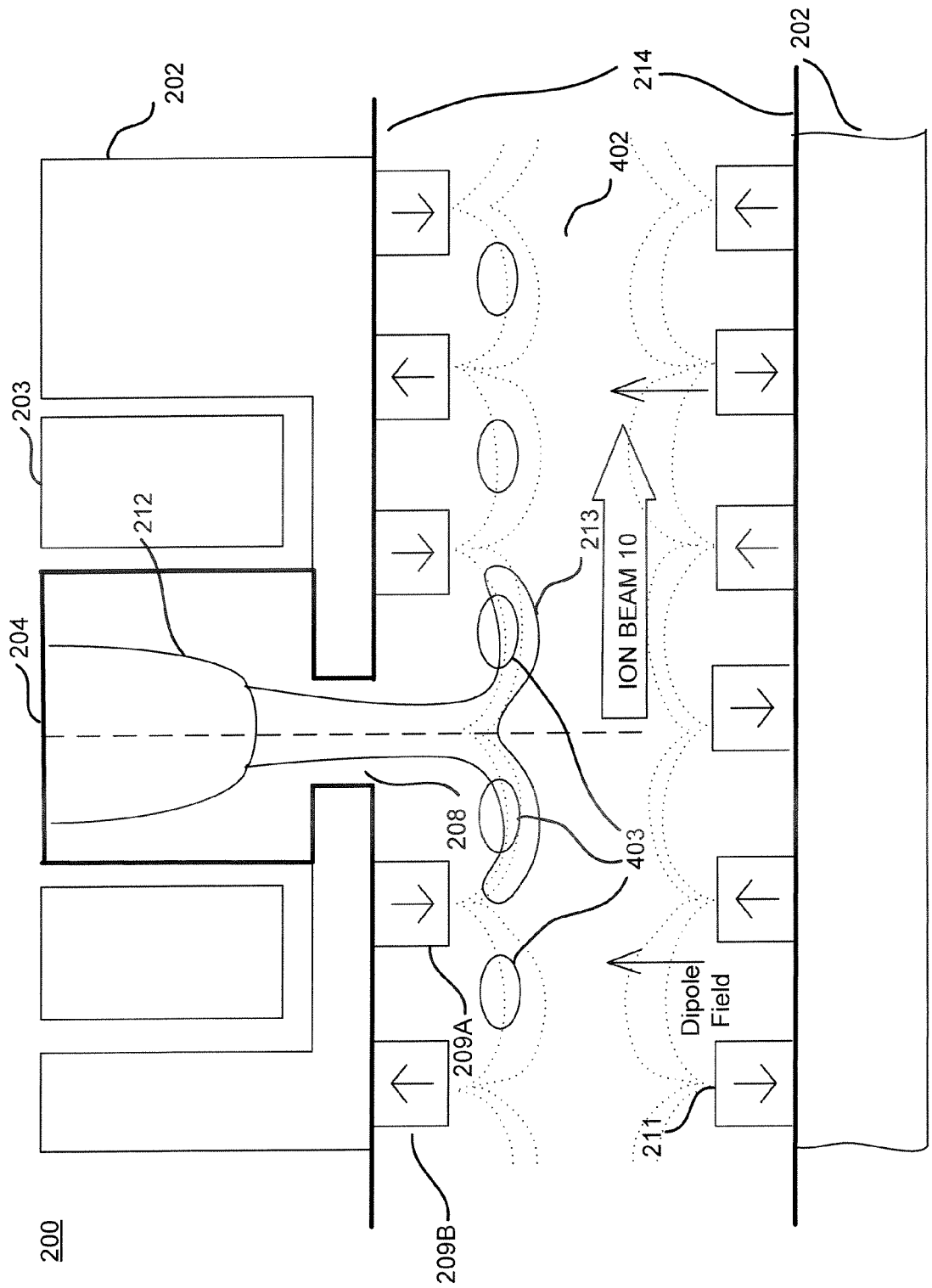
FIG. 4 shows an exemplary detail sectional view of a cusp coupled plasma injection system in accordance with an embodiment of the present disclosure.

In FIG. 4, there is shown an exemplary detailed sectional view of a cusp coupled plasma injection system 200 in accordance with an embodiment of the present disclosure. After the generation of plasma 212, an initial plasma injection region 213 from the plasma chamber 204 is limited to regions around the aperture 208 because plasma 212 tends to localize along the magnetic field lines. As explained above, the multi-cusped magnetic field generated by the plasma extracting magnet arrays 209 illustrated by curved magnetic field lines 402 causes the plasma to flow along the cusp line 302. A cusp coupled plasma injection region 403 may be formed along the cusp line 302 because of the "cross-B" (x B) drift motion. Hence, the "cross-B" (x B) drift motion may carry the plasma 212 away from the aperture 208 region and thus uniformly distribute the plasma 212 along the path of the ion beam 10.

Figure 5:
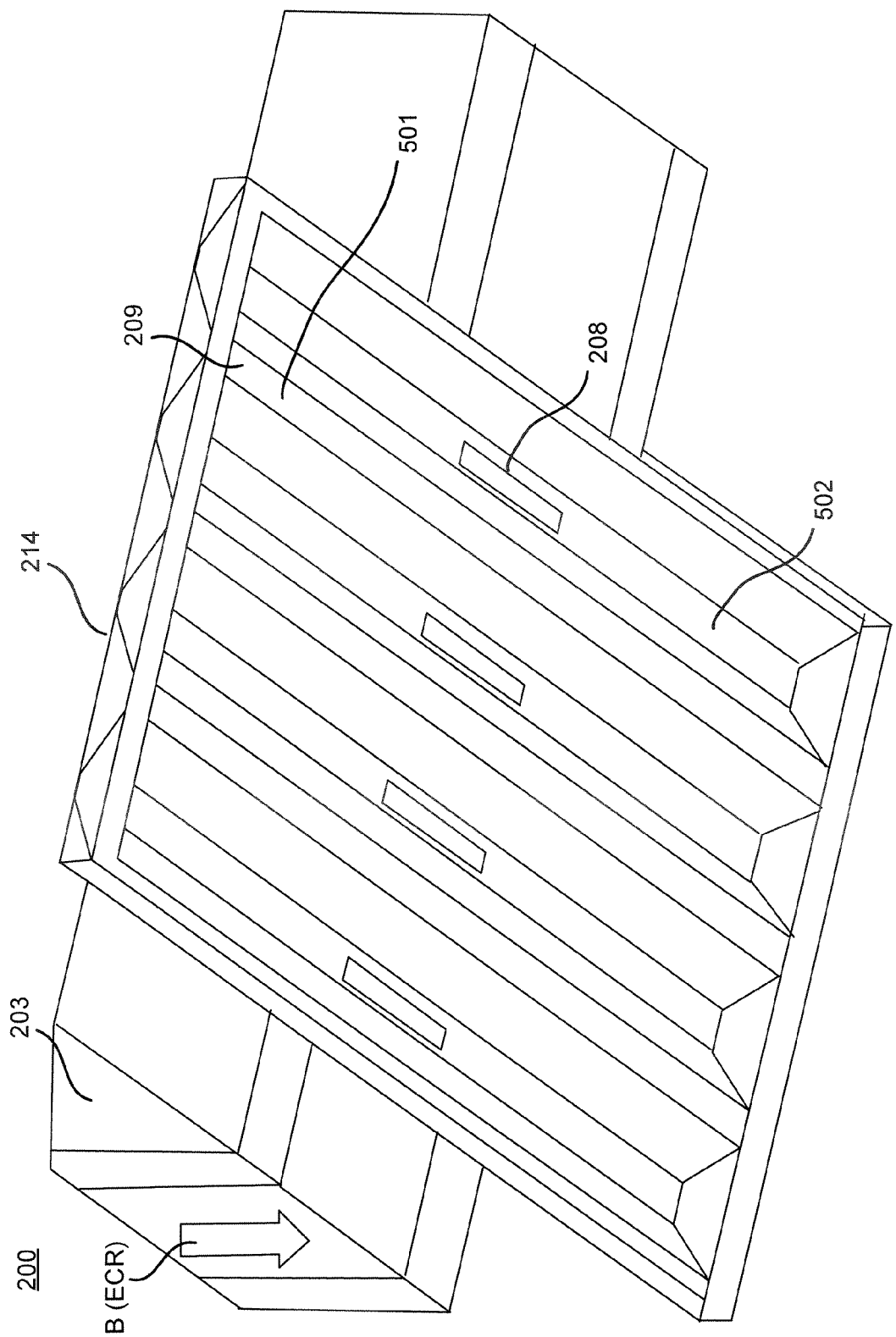
FIG. 5 shows an exemplary isometric view of a cusp coupled plasma injection system in accordance with an embodiment of the present disclosure.

FIG. 5 illustrates an exemplary isometric view of a cusp coupled plasma injection system 200 in accordance with an embodiment of the present disclosure. As mentioned above, microwave energy accelerates electrons via electron cyclotron resonance (ECR) within the interior space of the plasma chamber 204. The electron motion ionizes the gas and thus produces the plasma 212. The plasma 212 may be injected along the path of the ion beam 10 by magnetic dipole field (B) through apertures 208. Beamguide 214 may be configured to have alternating sloping convex portions 501 and sloping concave portions 502. The apertures 208 may be formed at the concave portions 502 of the beamguide 214, while the plasma extracting magnet arrays 209 may be formed at the convex portion 501.

Figure 6:
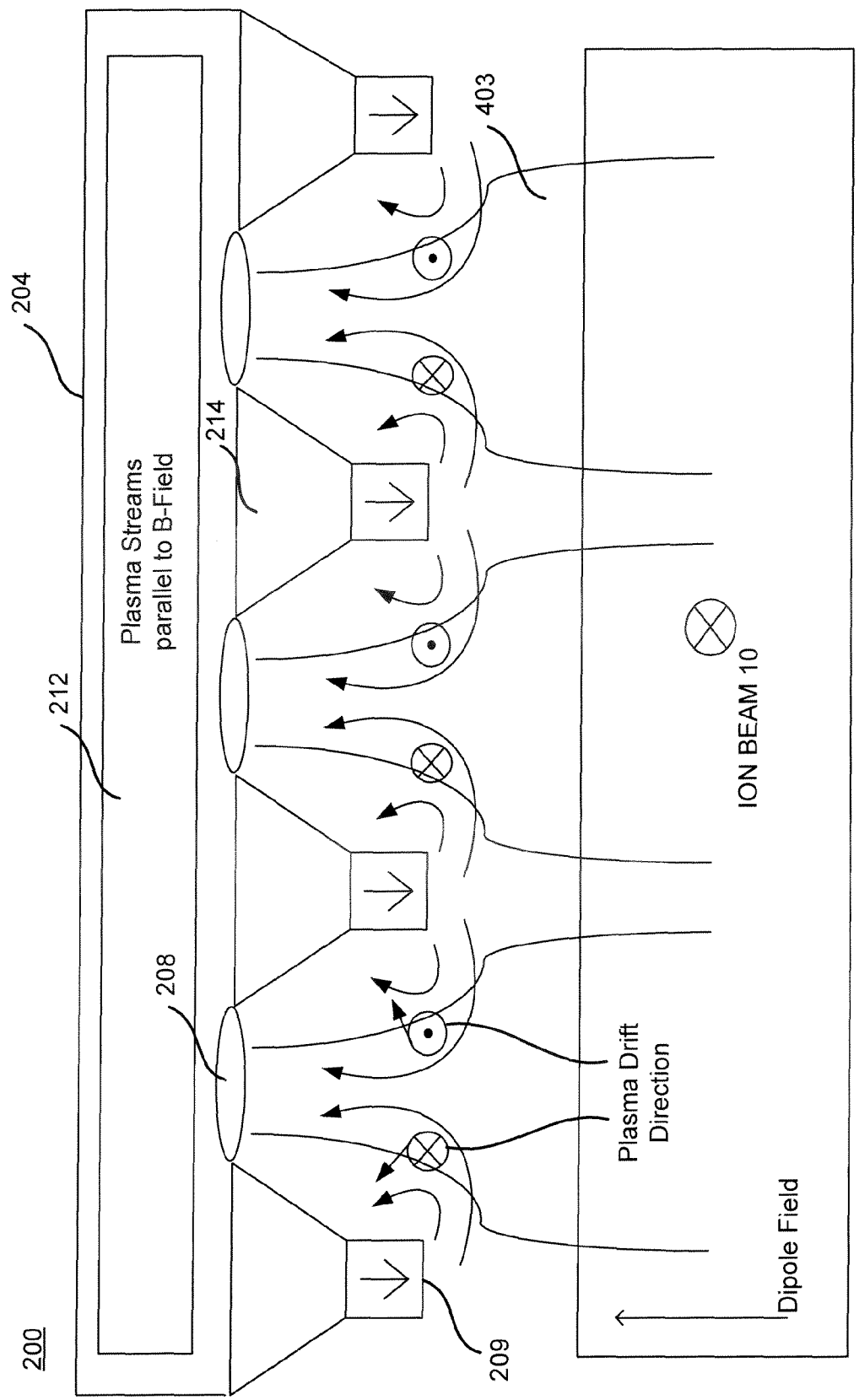
FIG. 6 shows an exemplary sectional view of a cusp coupled plasma injection system in accordance with an embodiment of the present disclosure.

FIG. 6 illustrates an exemplary sectional view of the cusp-coupled plasma injection system 200 in accordance with an embodiment of the present disclosure. As mentioned above, "cross-B" (x B) drift mechanisms allow the plasma 212 to propagate along the cusp line 302. The plasma has a higher density at a region around the apertures 208 and thus tends to flow out to the inner wall of the beamguide 214 where the plasma density is lower. The E cross B (E x B) drift mechanism may cause the plasma 212 to flow in the "cross-B" (x B) loop by the potential drop from the plasma to the inner wall of the beamguide 214. Finally, the curvature drift (R x B) mechanism of the "cross-B" (x B) loop facilitates the flow of the plasma through a centrifugal force effect. The combination of the diamagnetic drift, the E cross B (E x B) drift, and the curvature drift (R x B) allows the flow of the plasma in the same direction along the cusp line 302.

Figure 7:
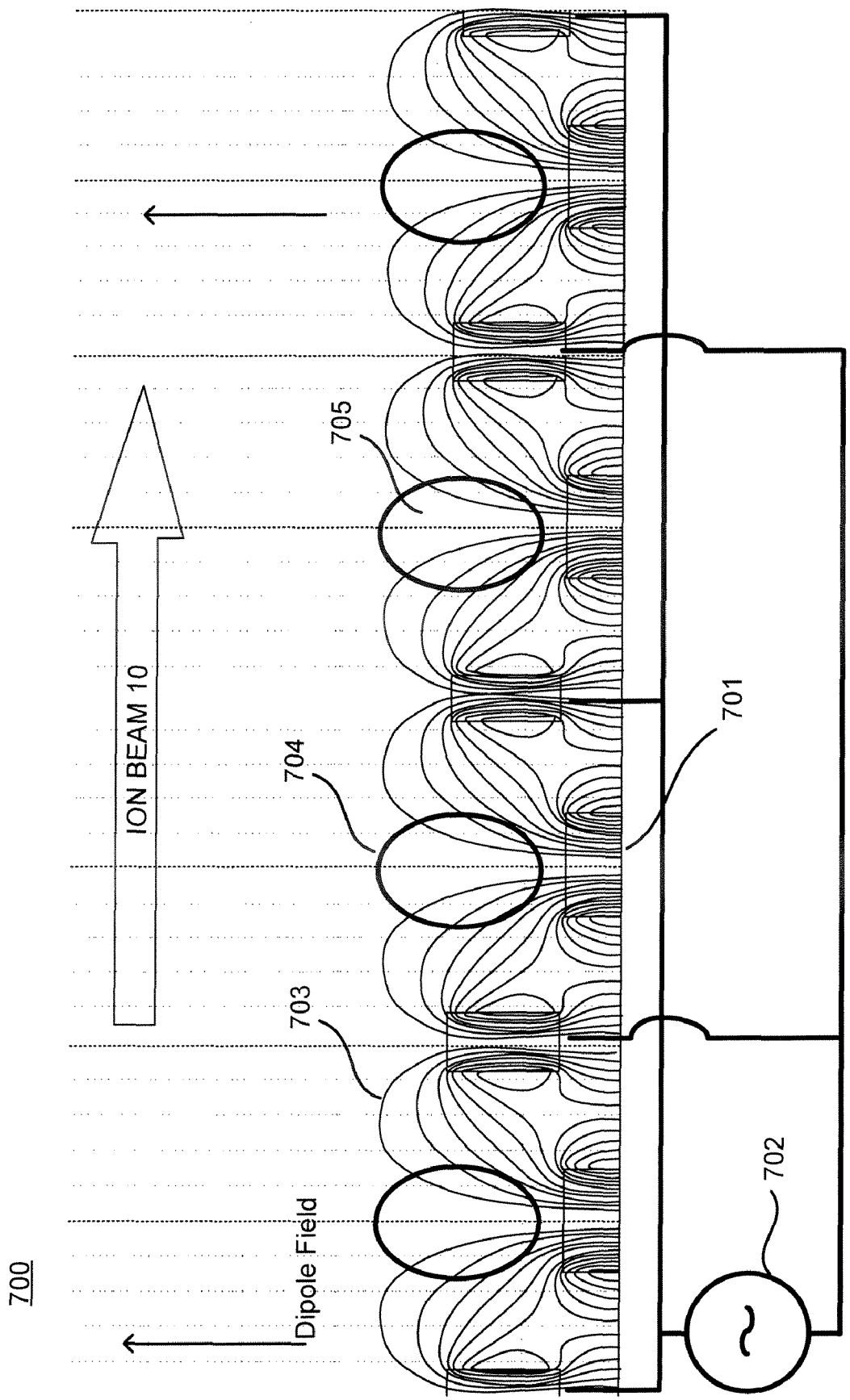
FIG. 7 shows a sectional view of an RF cusp coupled plasma injection system in accordance with an embodiment of the present disclosure.

FIG. 7 illustrates an exemplary sectional view of an RF cusp coupled plasma injection system 700 in accordance with an embodiment of the present disclosure. A plurality of magnet arrays 701 are provided in similar fashion to the plasma extracting magnet arrays 209 of FIGS. 2-6. The magnet arrays 701 may be employed within at least a portion of the ion beam 10. The magnet arrays 701 may be coupled to an electric power source 702, for example, an RF power source, as illustrated in FIG. 7. The RF power source 702 may generate a potential difference between the magnet arrays 701 to thereby generate plasma 705. The magnet arrays 701 operate as an RF electrodes. A cooperative interaction between the magnetic field and the electric field results in the plasma generation in plasma generating region 704. Also, the magnet arrays 701 may generate a multi-cusped magnetic field 703 in order to uniformly distribute plasma within the plasma generating region 704 in the path of the ion beam 10. Electrons moving within plasma generating region 704 continue moving until they collide with a gas, and at least some of the electrons have sufficient energy to ionize a portion of the gas, thereby generating a plasma 705.

The RF discharge condition in plasma generating region 704 advantageously provides enhancement of the ion beam 10, whereby beam integrity is improved along the longitudinal length of the beamguide 214. The creation of the RF plasma in one or more plasma generating regions 704 around the ion beam 10 prevents beam "blow-up" by facilitating the transfer of energy to the plasma surrounding the ion beam 10, thereby enhancing the ion beam 10.

It will be appreciated that the sizing, orientation, and spacing of magnet arrays 701 may allow the location of the plasma generating region 704 to be generated in accordance with desired ion beam containment goals. For example, the strength of the magnet arrays 701 may be varied by changing the distance between the inner surface of the magnet arrays 701 and the plasma generating region 704. In this manner, the distance may be adjusted according to ion beam size. In addition, the spacing between adjacent magnet arrays 701 may be changed in order to vary the spacing between adjacent plasma generating regions 704. Furthermore, the relative orientations of magnetic pole faces of adjacent magnets 701 may be varied in order to provide additive magnetic field lines between adjacent magnets 701. Many different magnet sizes, orientations, and spacings are possible and contemplated as falling within the scope of the present disclosure.

Figure 8:
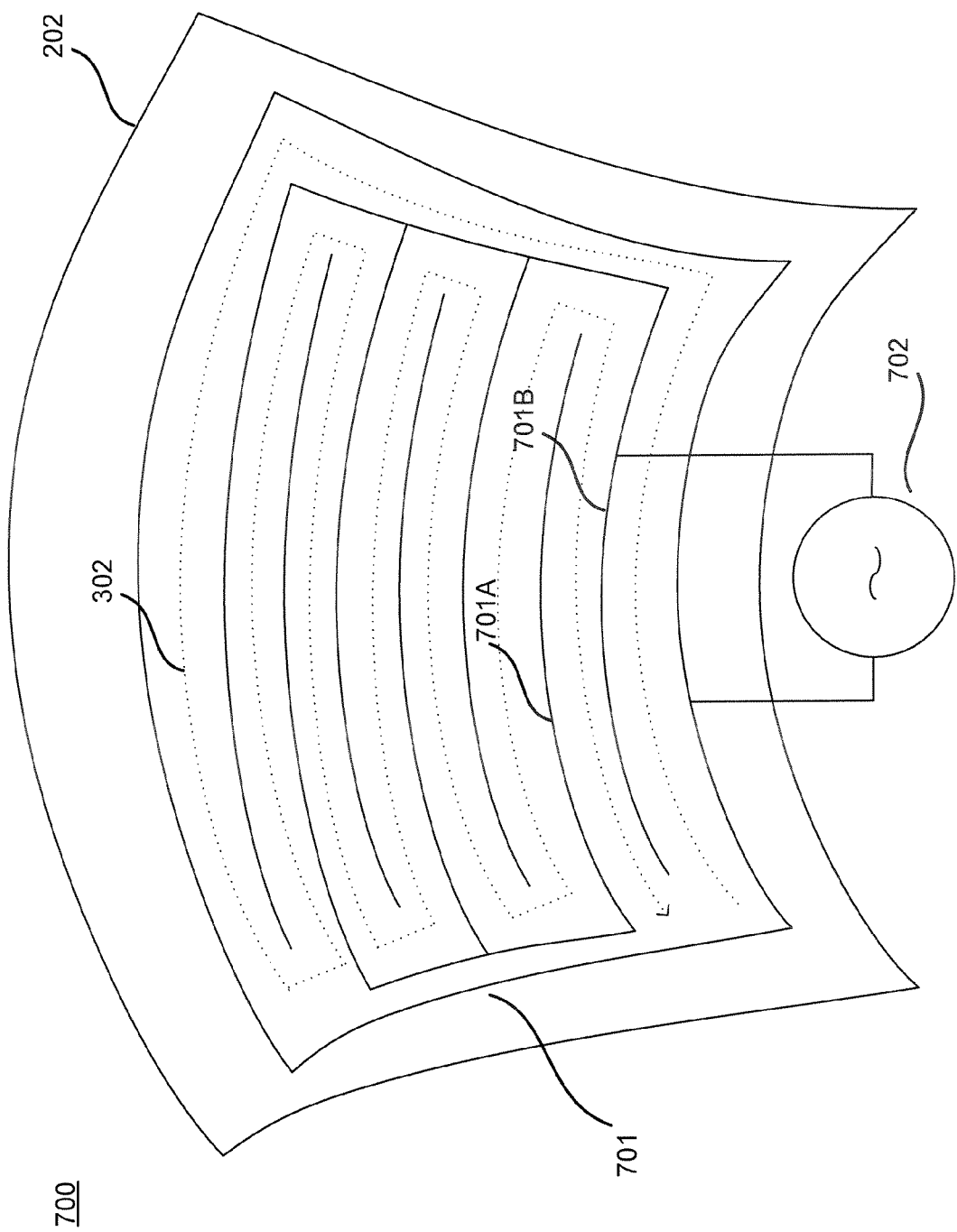
FIG. 8 shows a planar view of an RF cusp coupled plasma injection system in accordance with an embodiment of the present disclosure.

FIG. 8 illustrates an exemplary planar view of the RF cusp coupled plasma injection system 700 in accordance with an embodiment of the present disclosure. The magnet arrays 701 are configured to form a pair of interdigitated magnet arrays 701A and 701B. For example, the RF power source 702 may be applied between magnet arrays 701A and 701B. The gap between magnet arrays 701A and 701B may be small comparing to the physical gap of the beamguide 214. The magnet arrays 701 may take very little space, thus the plasma generator can be made to be a small fraction of the physical gap of the beamguide 214 that may be highly advantageous for beam transportation. As is generally appreciated, plasma experiences a substantial resistance across magnetic field lines, but can readily diffuse along such field lines. Thus, plasma generated along a wall of the beamguide 214 may readily diffuse across to an opposing wall, thereby providing relatively uniform plasma.

Figure 9:
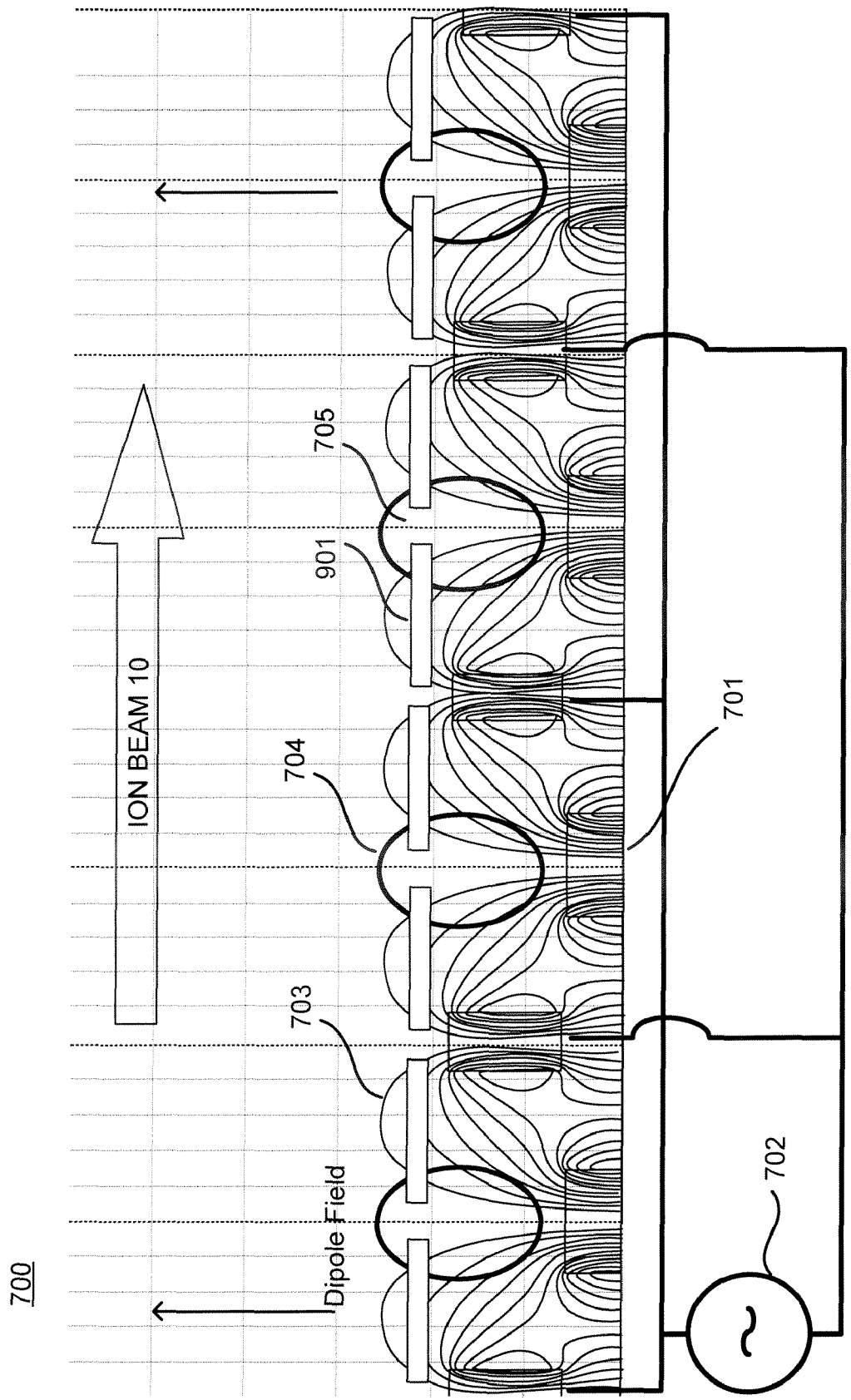
FIG. 9 shows another exemplary of an RF cusp coupled plasma injection system in accordance with an embodiment of the present disclosure.

FIG. 9 illustrates another exemplary sectional view of the RF cusp coupled plasma injection system 700 in accordance with an embodiment of the present disclosure. The plasma injection system 700 may further include a shield member 901 to protect the magnet arrays 701. Without such shield member 901, any stray particles from the ion beam 10 may impinge on the magnet arrays 701. The stray particles from the ion beam 10 may damage and/or contaminate the magnet arrays 701. Thus, the shield member 901 protects the magnet arrays 701 from damages and/or contaminations from the ion beam 10. The shield member 901 may be made from suitable metal (e.g., aluminum), silicone, elastomer, and/or other suitable material. In other embodiments, the shield member 901 may be placed directly on the magnet arrays 701 in order to provide a better coverage of the magnet arrays 701.

Figure 10:
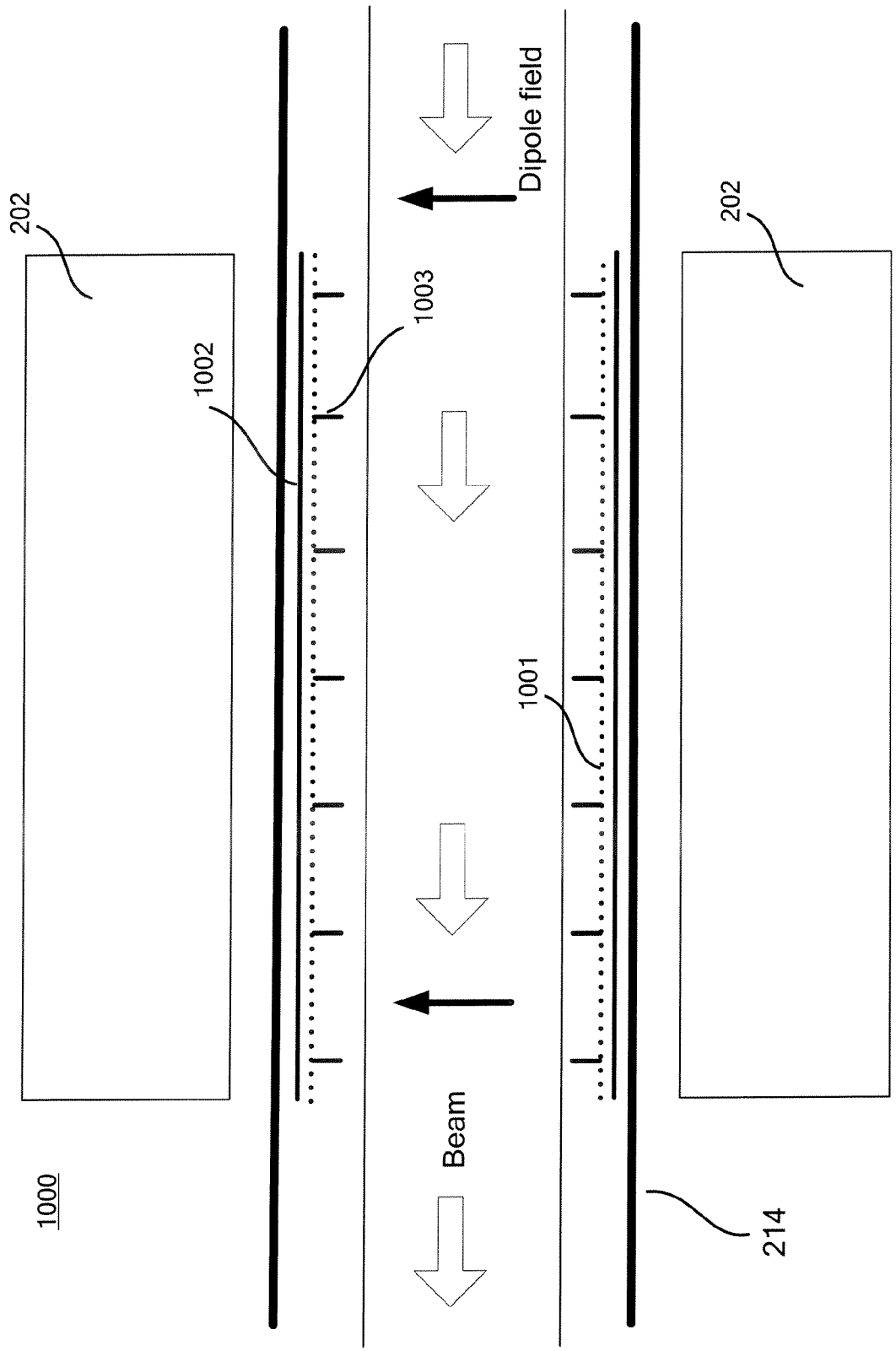
FIG. 10 shows an exemplary electrostatic plasma confinement device in accordance with an embodiment of the present disclosure.

FIG. 10 illustrates an exemplary sectional view of an electrostatic plasma confinement device 1000 in accordance with an embodiment of the present disclosure. A magnetic field produced by pole piece of the bending magnet 202 creates a strong confinement in one direction as electron diffusion across the magnetic field is very limited. However, elelctrons move freely along field lines to the inner walls of beamguide 214 where the electrons are lost to the walls. The confinement device 1000 may be located on the inner walls of beamguide 214 to confine the flow of electrons. A grounded high transparency fine mesh grid 1001 made from metal may be located near the inner wall of the beamguide 214. A negatively biased plate 1002 made of a metal material may be placed behind the grounded high transparency fine mesh grid 1001. The negatively biased plate 1002 may repel beam plasma electrons that may have propagated beyond the grounded high transparency fine mesh grid 1001. The negatively biased plate 1002 may repel the beam plasma electrons back into the ion beam 10. The grounded high transparency fine mesh grid 1001 may be a delicate element and thus may further include ion scrapers 1003 to protect from damage that may be caused by impinging ions.

The grounded high transparency mesh grid 1001 may be smaller than a Debye length (~1 mm or smaller). The size of the grounded high transparency mesh grid 1001 may be critical because if the size of the grounded high transparency mesh grid 1001 is greater than the Debye length, the grounded high transparency mesh grid 1001 may be shielded by the plasma and fail to provide a ground reference for the ion beam 10.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A plasma injection system for space charge neutralization of an ion beam, comprising:
a first array of magnets and a second array of magnets positioned along at least a portion of an ion beam path the first array being on a first side of the ion beam path to produce a first multi-cusp magnetic field, and the second array being on a second side of the ion beam path to produce a second multi-cusp magnetic field, and the first side opposing the second side, at least two adjacent magnets in the first array of magnets having opposite polarity; and
a plasma source configured to generate a plasma in a plasma chamber, the plasma source having a magnetic source to generate a local dipole magnetic field in the plasma chamber, and the plasma source having an aperture, wherein the local dipole magnetic field is aligned with the aperture and the first multi-cusp magnetic field to distribute the plasma along the ion beam path.

2. The plasma injection system according to claim 1, wherein at least two adjacent magnets in the second array of magnets have opposite polarity.

3. The plasma injection system according to claim 1, wherein the plasma source is further configured to generate the plasma by colliding electrons with a gas, and wherein the gas comprises at least one of an inert gas, an electronegative gas and an electropositive gas.

4. The plasma injection system according to claim 1, wherein the plasma source is embedded in a pole piece along at least a portion of the ion beam path.

5. The plasma injection system according to claim 4, wherein the first array of magnets and second array of magnets are positioned in a beamguide comprising alternating sloped concave portions and sloped convex portions.

6. The plasma injection system according to claim 5, wherein the first array of magnets or the second array of magnets are located at the convex portion of the beamguide.

7. The plasma injection system according to claim 5, wherein the beamguide further comprises a plurality of apertures located at the concave portion of the beamguide.

8. The plasma injection system according to claim 1, wherein at least one of the first array of magnets or the second array of magnets is a permanent magnet or a coil.

9. The plasma injection system according to claim 1, wherein the at least one magnet in the first array or the at least one magnet in the second array is configured to direct the flow of the plasma in a cross-B loop.

10. The plasma injection system according to claim 9, wherein the cross-B loop is formed by at least one of diamagnetic drift, E cross B drift, and curvature drift.

11. The plasma injection system according to claim 1, wherein the first array of magnets are configured interdigitally.

12. The plasma injection system according to claim 1, wherein the second array of magnets are configured interdigitally.

13. The plasma injection system according to claim 1, wherein the first array of magnets and the second array of magnets are positioned in an analyzer magnet.

14. The plasma injection system according to claim 1, wherein the first array of magnets and the second array of magnets are positioned in a collimator magnet.

15. The plasma injection system according to claim 1, wherein the plasma source comprises a microwave source and the magnetic source comprises a coil.

\* \* \* \* \*